United States Patent [19]
Lee

[11] Patent Number: 5,891,770
[45] Date of Patent: Apr. 6, 1999

[54] METHOD FOR FABRICATING A HIGH BIAS METAL OXIDE SEMICONDUCTOR DEVICE

[75] Inventor: Jia-Sheng Lee, Hsinchu, Taiwan

[73] Assignee: United Microelectronics Corp., Taiwan

[21] Appl. No.: 98,397

[22] Filed: Jun. 17, 1998

[30] Foreign Application Priority Data

May 4, 1998 [TW] Taiwan ................................ 87106848

[51] Int. Cl.$^6$ .............................................. H01L 21/8238
[52] U.S. Cl. ........................ 438/221; 438/222; 438/224; 438/229; 438/259; 438/270; 438/296; 438/430; 438/437
[58] Field of Search ....................... 438/199, 207, 438/221, 222, 223, 224, 229, 270, 259, 424, 296, 430, 435, 437, 163, 168, 216, 217, 218

[56] References Cited

U.S. PATENT DOCUMENTS 4,729,964   3/1988   Natsuaki et al. .......................... 437/29

*Primary Examiner*—Peter Toby Brown
*Assistant Examiner*—Long Pham
*Attorney, Agent, or Firm*—Knobbe, Martens, Olson & Bear LLP

[57] ABSTRACT

A method for fabricating a high bias metal oxide semiconductor device includes using a trench structure instead of the conventional field oxide layer, constructing a structure with a vertical voltage gradient and performing punch implantation and threshold voltage implantation under a doped N$^-$ region and a doped P$^-$ region to increase the channel length.

51 Claims, 6 Drawing Sheets

METHOD FOR FABRICATING A HIGH BIAS METAL OXIDE SEMICONDUCTOR DEVICE

CROSS-REFERENCE TO RELATED APPLICATION

This application claims the priority benefit of Taiwan application serial no. 87106848, filed May 4, 1998, the full disclosure of which is incorporated herein by reference.

BACKGROUND OF THE INVENTION

1. Field of the Invention

This invention relates to a metal oxide semiconductor (MOS), and more particularly to a method for fabricating a high bias complementary MOS (CMOS).

2. Description of Related Art

As the size of semiconductor device is reduced, the channel length is accordingly reduced, resulting in a semiconductor device with a faster operational speed. However, even though the shorter channel length raises the operational speed, a channel length that is too short creates other serious problems. These problems are generally called the short channel effect and are described as follows. If the bias applied on the semiconductor device is kept constant but the channel length is shortened, according to a formula of "electric field (E-field)=bias/channel length", where E-field is measured in units of "V/m", the electrons within the channel gain more energy due to the stronger E-field so that the possibility of an electrical breakdown is higher.

In conventional methodology, a high bias MOS device usually employs an isolation layer and a drift region under the isolation layer to increase the distance between the source/drain regions and the gate. This allows the MOS device to work normally, even when a high bias is applied.

FIGS. 1A–1C are cross sectional views schematically illustrating some conventional high bias MOS devices.

In FIG. 1A, an $N^-$ doped region 101, an $N^+$ doped region 102 and a gate layer 103 are formed on a semiconductor substrate such as a $P^-$ substrate 100. The $N^+$ doped region 102 is the source/drain region. The $N^-$ doped region 101 is used to increase the distance between the source/drain region 102 and the gate 103.

FIG. 1B shows a $P^-$ substrate 110 with an $N^-$ doped region 111, an $N^+$ doped region 112 for a source/drain region, a spacer 113 and a gate layer 114. The $N^-$ doped region 111 and the spacer 113 are used to increase the distance between the source/drain region 112 and the gate 114.

FIG. 1C shows a $P^-$ substrate 120 with an $N^-$ doped region 121, an $N^+$ doped region 122 for source/drain region, a field oxide (FOX) 123 and a gate layer 124. The $N^-$ doped region 121 and spacer 123 are used to increase the distance between the source/drain region 122 and the gate 124.

The structures of the conventional high bias MOS devices shown in FIGS. 1A–1C are planar. To obtain an enough space for isolations between MOS devices, the planar dimension would have to be increased. This contradicts to the trend of reducing the critical dimension in semiconductor devices. This means that because the channel length in the conventional high bias MOS device can't be effectively reduced, the integration of a device is undermined so that a high bias MOS device can't be reduced in size to submicron dimensions.

SUMMARY OF THE INVENTION

It is therefore an objective of the present invention to provide a method for fabricating a high bias CMOS device with a vertical structure that saves horizontal space.

It is an another objective of the present invention to provide a method for fabricating a high bias CMOS device, which is applicable for semiconductor devices with submicron dimensions, for which integration is, therefore, increased.

It is still another objective of the present invention to provide a method for fabricating a high bias CMOS device, in which only the region under the channel of the CMOS is performed by a punch implantation. The doped regions of $P^-$ or $N^-$ are not punch implanted. Therefore, the phenomena of junction breakdown and punch through are effectively avoided.

In accordance with the foregoing and other objectives of the present invention, a method for fabricating a high bias CMOS device first includes a first oxide layer and a nitride layer being sequentially formed over a semiconductor substrate. Then, the nitride layer, the first oxide layer and the substrate are patterned and etched in a several steps. This process forms a number of trenches serving as isolation between each CMOS device unit. Then, a second oxide layer is formed over the trenches by oxidation and a third oxide layer is deposited, filling the trenches. An N well and a P well are formed between the trenches. Then, the nitride layer and the first oxide layer are removed. A fourth oxide layer is formed over the substrate. Next, a first $P^-$ region is formed over the N well and a first $N^-$ region is formed over the P well. Subsequently, a $P^+$ region is formed over the N well and an $N^+$ region is formed over the P well. The fourth oxide layer, the $P^+$ region and the first $P^-$ region are etched to form a first opening, which exposes the N well. In the same step, the fourth oxide layer, the $N^+$ region and the first $N^-$ region are etched to form a second opening, which exposes the P well. Then, the fourth oxide layer is removed and a fifth oxide layer is formed over the substrate by oxidation. A punch implantation for P-channel MOS (PMOS) and a threshold voltage ($V_t$) implantation are performed on the N well, and a punch implantation for N-channel MOS (NMOS) and a threshold voltage ($V_t$) implantation are performed on the P well. Then, the fifth oxide layer is removed and a gate oxide layer is formed over the substrate. A first conductive layer is formed on the gate oxide layer at the bottom of the first opening and a second conductive layer is formed on the gate oxide layer at the bottom of the second opening. Then, the N well is lightly doped with a P-type dopant to form a second $P^-$ region over the N well inside the first opening. Then, the P well is lightly doped with an N-type dopant to form a second $N^-$ region over the P well inside the second opening. After the second $P^-$ and the second $N^-$ regions are formed, a high bias CMOS structure is formed.

In accordance with the foregoing and other objectives of the present invention, another method for fabricating a high bias CMOS device includes sequentially forming a first oxide layer and a nitride layer over a semiconductor substrate. Then, the nitride layer, the first oxide layer and the substrate are patterned and etched in a number of steps to form trenches serving as isolation between each CMOS device unit. A second oxide layer is then formed over the trenches by oxidation. A third oxide layer is deposited in and fills the trenches. Then, an N well and a P well are formed between the trenches. The nitride layer and the first oxide layer are removed. Then, a fourth oxide layer is formed over the substrate. Next, a first $P^-$ region is formed over the N well and a first $N^-$ region is formed over the P well. Subsequently, a $P^+$ region is formed over the N well and an $N^+$ region is formed over the P well. The fourth oxide layer, the $P^+$ region and the first $P^-$ region are etched to form a first opening, which exposes the N well. In the same step, the fourth oxide layer, the N⁺ region and the first N⁻ region are etched to form a second opening, which exposes the P well. Then, a punch implantation for P-channel MOS (PMOS) and a threshold voltage ($V_t$) implantation are performed on the N well, and a punch implantation for N-channel MOS (NMOS) and a threshold voltage ($V_t$) implantation are performed on the P well. The fourth oxide layer is removed and a gate oxide layer is formed over the substrate. Then, a first conductive layer is formed on the gate oxide layer at the bottom of the first opening and a second conductive layer is formed on the gate oxide layer at the bottom of the second opening. Then, the N well is lightly doped with a P-type dopant to form a second P⁻ region in the N well in the area under the sides of the first opening and the P well is lightly doped with an N-type dopant to form a second N⁻ region in the P well in the area under the sides of the second opening.

In forgoing, the third oxide layer is formed by chemical vapor deposition using a high-density plasma source.

In the step of forming the N well and the P well, after an N-type dopant and a P-type dopant are implanted in the N well region and the P well region, respectively, a thermal process is performed to drive the dopants in to form the wells.

In the step of forming the first P⁻ region and the first N⁻ region, after a P-type dopant and an N-type dopant are lightly implanted in the N well and the P well, respectively, a thermal process is performed to drive the dopants in to form the first P⁻ region and the first N⁻ region.

In the step of forming the P⁺ region and the N⁺ region, after a P-type dopant and an N-type dopant are heavily implanted to the N well and the P well, respectively, a thermal process is performed to drive the dopants in to form the P⁺ region and the N⁺ region.

The step of removing the fourth oxide layer and forming the fifth oxide layer are for the purpose of cutting the sharp corners of the substrate.

$P^{31}$ is the ion source for the PMOS punch implantation and $BF_2^+$ is the ion source for the $V_t$ implantation. $B^{11}$ is the source for the NMOS punch implantation and $BF_2^+$ is the source for the $V_t$ implantation.

The step of forming the first conductive layer and the second conductive layer, further includes forming a polysilicon layer inside the first opening and the second opening, which is then doped and patterned to form the first conductive layer and the second conductive layer, respectively. The bottoms of the openings are only partially covered by the conductive layers.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2M are cross sectional views schematically illustrating a high bias CMOS device, according to a preferred embodiment of the invention.

Figure 1A:
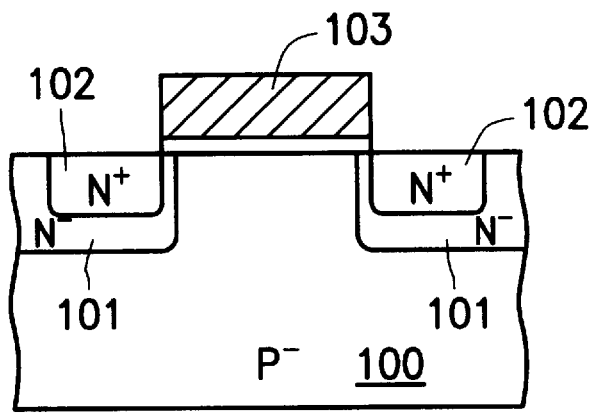
FIGS. 1A–1C are cross sectional views schematically illustrating some conventional high bias MOS devices.
Figure 1B:
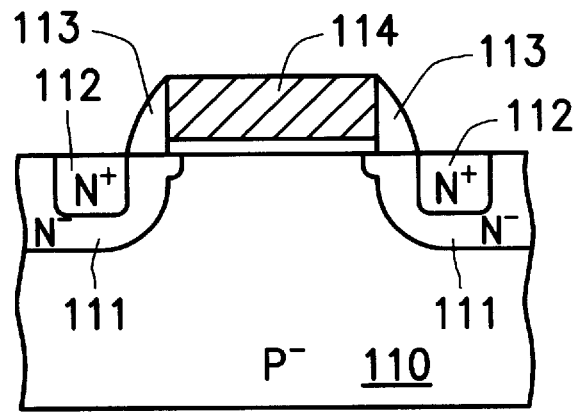
Figure 1C:
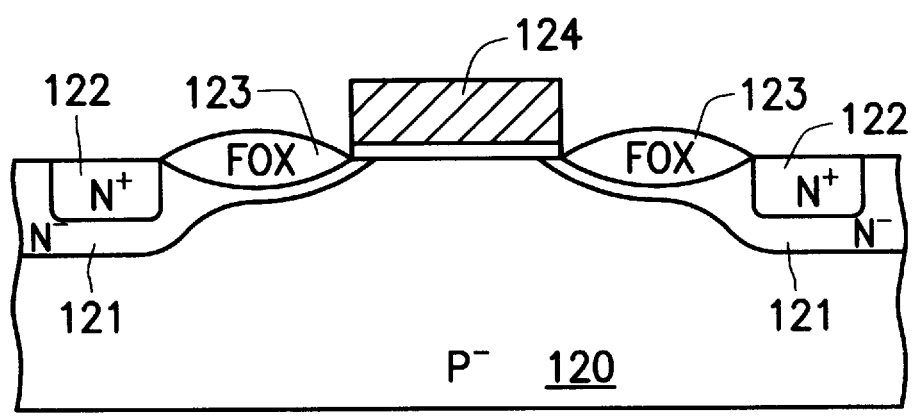
Figure 2A:
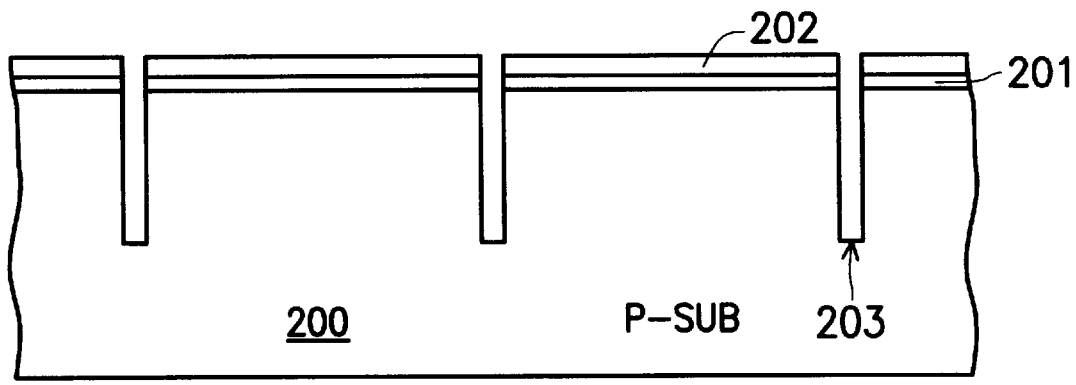
FIGS. 2A–2M are cross sectional views schematically illustrating a high bias CMOS device, according to a preferred embodiment of the invention.

Referring to FIG. 2A, a first oxide layer 201 and a nitride layer 202 are sequentially formed over a semiconductor substrate 200, such as a P-substrate. Then, a patterning and an etching are performed on the nitride layer 202, the first oxide layer 201 and the substrate 200 to form a number of trenches 203 for isolation between each CMOS device unit. The first oxide layer 201, also called the pad oxide, is formed by thermal oxidation. The nitride layer 202 is formed, for example, by a chemical vapor deposition (CVD) process.

Figure 2B:
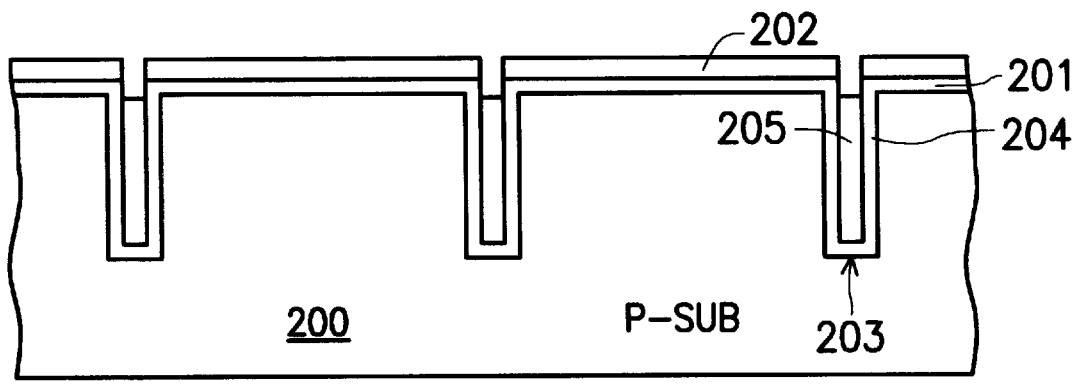

Referring to FIG. 2B, a second oxide layer 204 is formed over the trenches 203 by oxidation so that the first oxide layer 201 and the second oxide layer 204 are formed together. Then, a third oxide layer 205 is deposited by CVD into the trenches 203. The trenches 203 are filled. The CVD process can be, for example, a high-density-plasma CVD (HDPCVD).

Figure 2C:
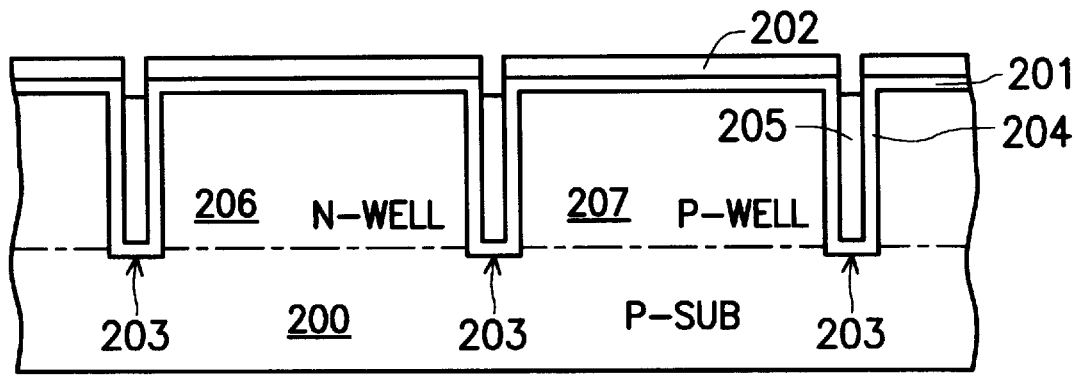

Referring to FIG. 2C, an N well 206 and a P well 207 are separately formed between the trenches 203 by doping the corresponding well regions with an N-type dopant and a P-type dopant, respectively. Then a thermal process is performed to drive the dopant in so that the N well 206 and the P well 207 are formed.

Figure 2D:
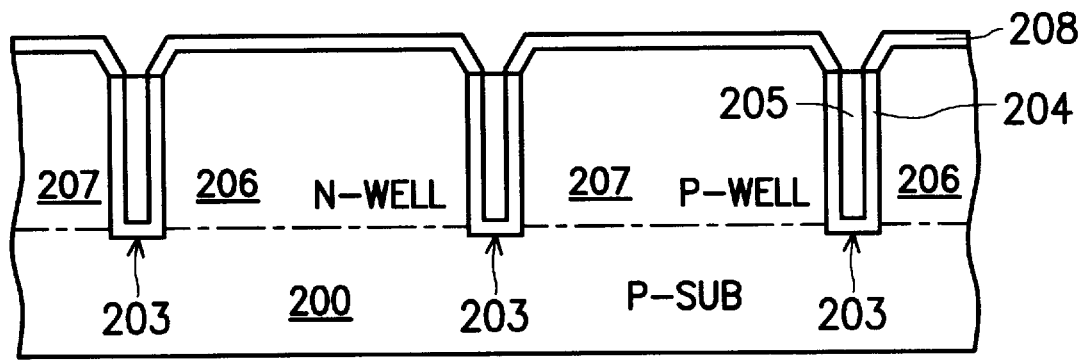

Referring to FIG. 2D, the nitride layer 202 and the first oxide layer 201 are removed, in the process of which the sharp corners on the top of the trenches 203 are cut at an angle. Then, a fourth oxide layer 208, also called the pad oxide, is formed over the substrate 200 by thermal oxidation.

Figure 2E:
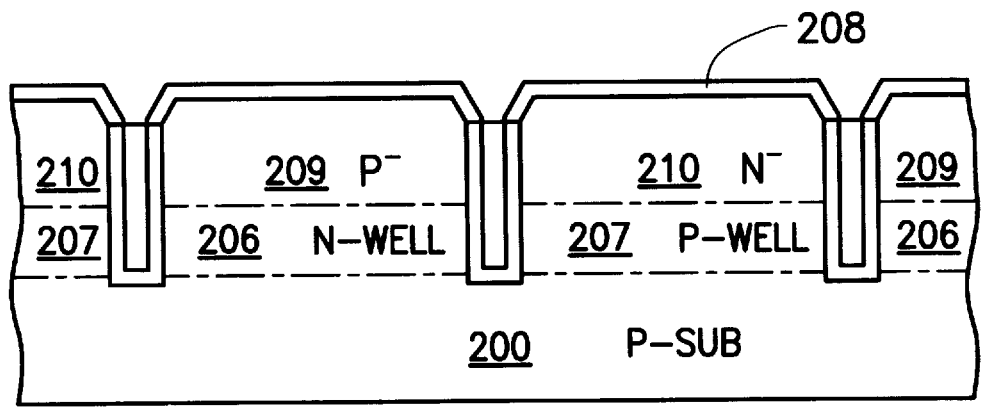

Referring to FIG. 2E, a first P⁻ region 209 is formed over the N well 206 by, for example, light doping with a P-type dopant, and a first N⁻ region 210 is formed over the P well 207 by, for example, light doping with an N-type dopant. Then a thermal process is performed to drive the dopants in.

Figure 2F:
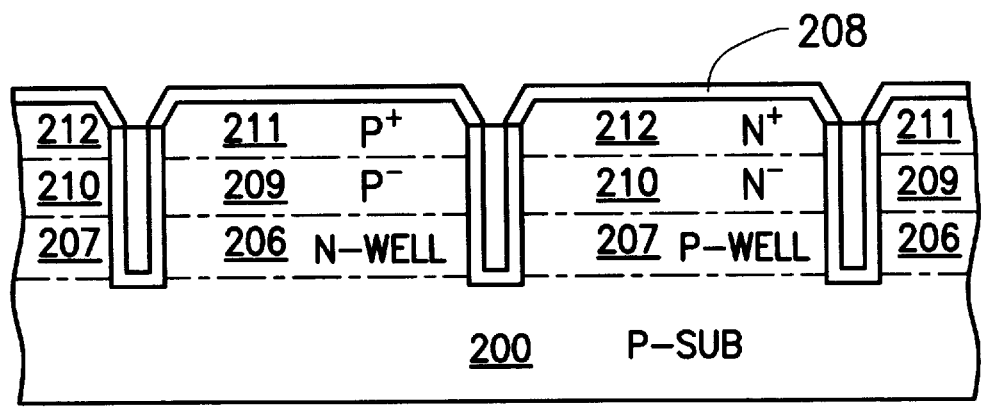
Figure 2G:
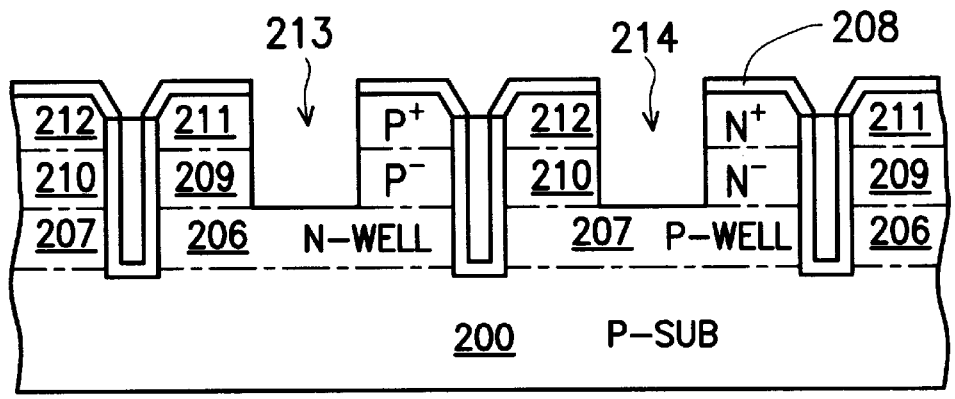

Referring to FIG. 2F, a P⁺ region 211 is formed over the N well 206 by heavy doping with a P-type dopant, and an N⁺ region 212 is formed over the P well 207 by heavy doping with an N-type dopant. Then, a thermal process is performed to drive in the dopants. Therefore, the N well 206 has the first P⁻ region 209 and the P⁺ region 211 on it, sequentially, and the N well 207 has the first N⁻ region 210 and the N⁺ region 212 on it, sequentially. The P⁺ region 211 serves as a P-channel MOS (PMOS) source/drain region and the N⁺ region 212 serves as an N-channel MOS (NMOS) source/drain region. Referring to FIG. 2G, an etching is performed on the fourth oxide layer 208, the P⁺ region 211 and the first P⁻ region 209 to form a first opening 213, which exposes the N well 206. At the same process, etching is also performed on the fourth oxide layer 208, the N⁺ region 212 and the first N⁻ region 210 to form a second opening 214, which exposes the P well 207. The etching, process is, for example, a dry etching.

Figure 2H:
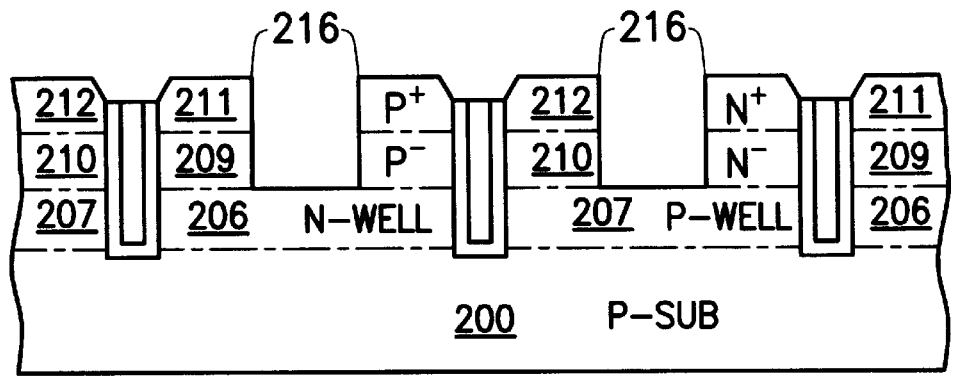
Figure 2I:
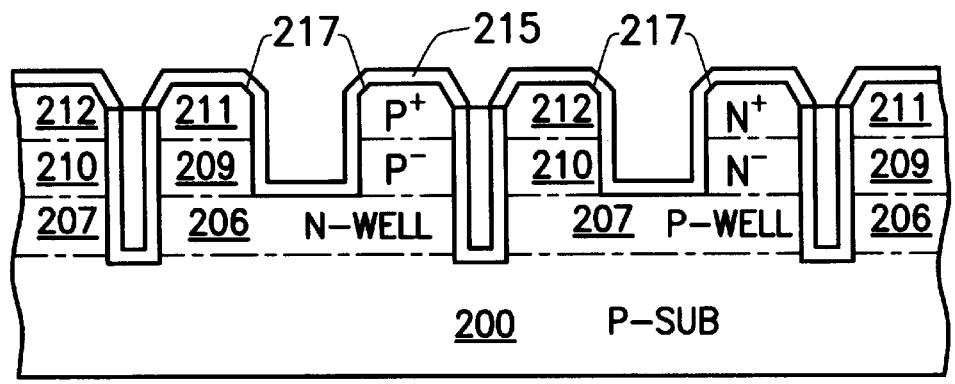

Referring to FIG. 2H and FIG. 2I, the fourth oxide layer 208 is removed and a fifth oxide layer 215 is formed over the substrate by oxidation. This process is to remove the sharp corners 216 on the top of the openings 213, 214 as shown in FIG. 2G. After the fifth oxide layer 215, or called the pad oxide, is formed, the sharp corners 216 become rounded corners 217.

Figure 2J:
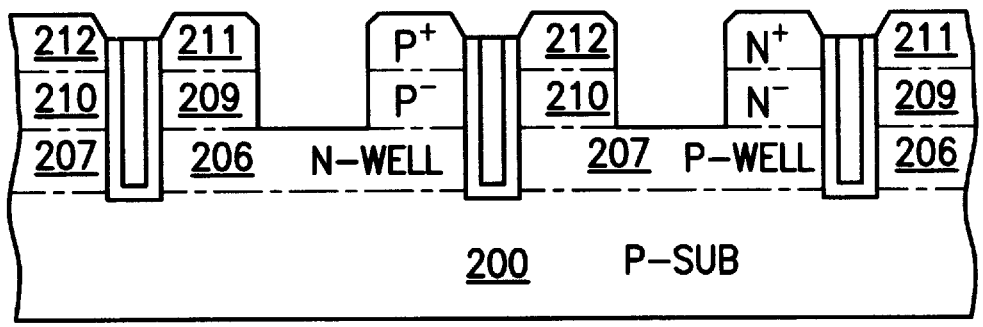

Referring to FIG. 2J, a punch implantation for PMOS and a threshold voltage ($V_t$) implantation are performed on the N well 206, and a punch implantation for NMOS and a threshold voltage ($V_t$) implantation are performed on the P well 207. Then, the fifth oxide layer 215 is removed. $P^{31}$ and $BF_2^+$ are the ion sources for the PMOS punch implantation and the $V_t$ implantation, respectively; and $B^{11}$ and $BF_2^+$ are the ion sources for the NMOS punch implantation and the $V_t$ implantation, respectively.

Figure 2K:
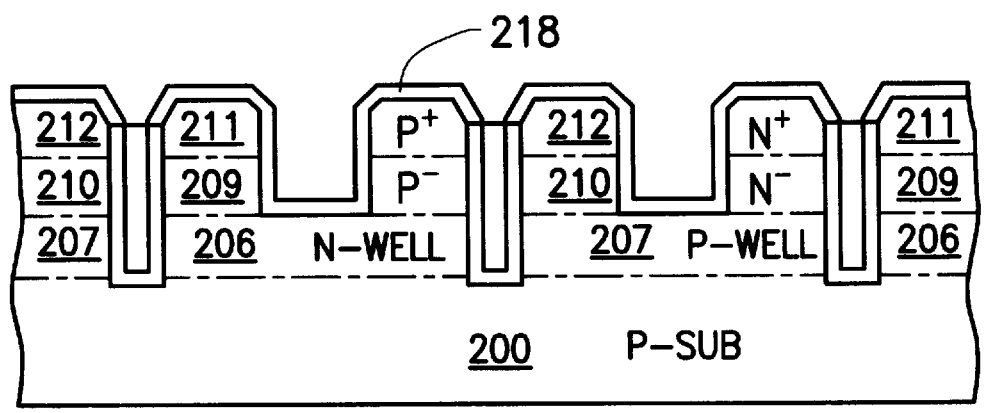

Referring to FIG. 2K, a gate oxide layer 218 is formed over the substrate 200 by, for example, CVD or thermal oxidation.

Figure 2L:
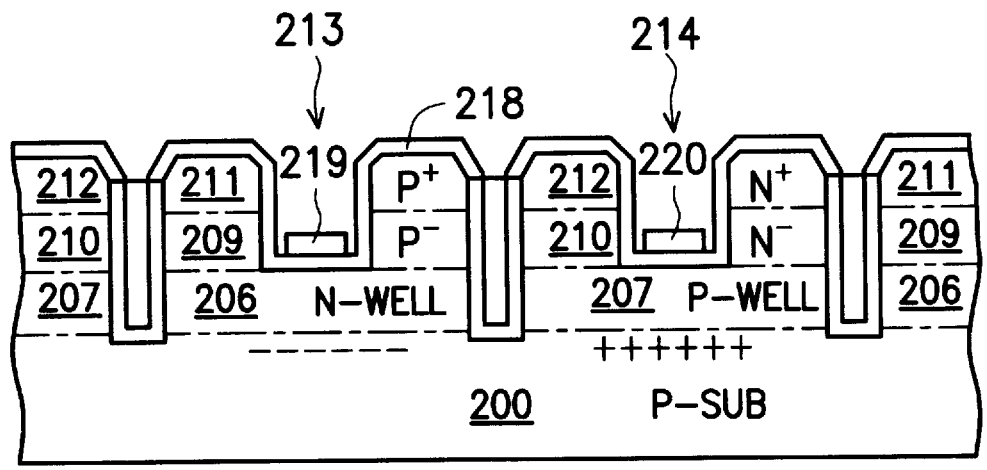

Referring to FIG. 2L, a first conductive layer 219 is formed on the gate oxide layer 218, at the bottom of the first opening 213, and a second conductive layer 220 is formed on the gate oxide layer 218, at the bottom of the second opening 214. The process of forming the first conductive layer 219 and the second conductive layer 220 includes formation of a polysilicon layer (not shown) inside the first opening 213 and the second opening 214, which is then doped, with, for example, $POCL_3$, and patterned to form the first conductive layer 219 and the second conductive layer 220, respectively. The bottoms of the openings 213, 214 are only partially covered by the conductive layers 219, 220, respectively. The first conductive layer 219 and the gate oxide layer 218 form a gate for the PMOS, and the second conductive layer 220 and the gate oxide layer 218 form a gate for the NMOS.

Figure 2M:
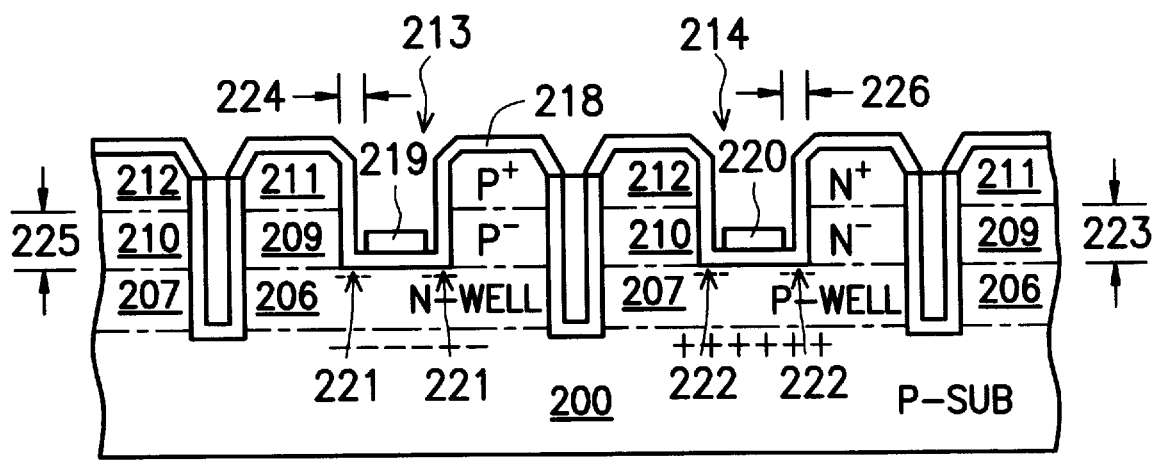

Referring to FIG. 2M, the N well 206 is lightly doped with a P-type dopant to form a second P⁻ region 221 in the N well 206 in the area under the sides of the first opening 213. Then, the P well 207 is lightly doped with an N-type dopant to form a second N⁻ region 222 on the P well 207 in the area under the sides of the second opening 214. The first P⁻ region 209 and the second P⁻ region 221 serve as the drift region of the PMOS and the first N⁻ region 210 and the second N⁻ region 222 serve as the drift region of the NMOS.

In conclusion, the invention providing a method for fabricating a high bias CMOS has the following advantages:

1. According the preferred embodiment as shown in FIG. 2M, the length of the drift regions 209, 221, 210, 222 is increased to form a structure with a vertical voltage gradient so that a small-sized CMOS device with high bias can be fabricated. For the PMOS, the drift region is composed of the depth 223 of the first P⁻ region 209 and the length 224 of the second P⁻ region 221. For the NMOS, the drift region is composed of the depth 225 of the first N⁻ region 210 and the length 226 of the second N⁻ region 222. Therefore, the length of the drift region is effectively increased.

2. The method for fabricating a high bias CMOS device uses the isolation trenches 203 as a replacement for the conventional isolation layers and uses the vertical voltage gradient structure to increase the length of the drift region. Therefore, the method of the invention can be applied in the fabrication of semiconductors with sub-micron dimensions to increase integration.

3. The process of punch implantation for implanting only on the drift regions 221, 222 is performed to effectively avoid the phenomena of junction breakdown and punch through.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a high bias metal oxide semiconductor device, the method comprising:

sequentially forming a first oxide layer and a nitride layer over a semiconductor substrate;

patterning the nitride layer, the first oxide layer and the substrate to form a trench serving as an isolation structure;

forming a second oxide layer over the trench by oxidation;

depositing a third oxide layer in the trench to fill the trench;

forming an N well and a P well between the trench;

removing the nitride layer and the first oxide layer;

forming a fourth oxide layer over the substrate;

forming a first P⁻ region over the N well;

forming a first N⁻ region over the P well;

forming a P⁺ region over the N well;

forming an N⁺ region over the P well;

etching the fourth oxide layer, the P⁺ region and the first P⁻ region to form a first opening, which exposes the N well, and etching the fourth oxide layer, the N⁺ region and the first N⁻ region to form a second opening, which exposes the P well;

removing the fourth oxide layer;

forming the fifth oxide layer;

performing a P-channel metal oxide semiconductor (PMOS) punch implantation and a threshold voltage ($V_t$) implantation on the N well;

performing an N-channel metal oxide semiconductor (NMOS) punch implantation and a threshold voltage ($V_t$) implantation on the P well;

removing the fifth oxide layer;

forming a gate oxide layer over the substrate;

forming a first conductive layer over the gate oxide layer at the bottom of the first opening on the N well, and a second conductive layer over the gate oxide layer at the bottom of the second opening on the P well;

lightly doping the N well with a P-type dopant to form a second P⁻ region under the first opening on the N well; and lightly doping the P well with an N-type dopant to form a second N⁻ region under the second opening on the P well.

2. A method for fabricating a high bias metal oxide semiconductor device, the method comprising:

forming a first oxide layer and a nitride layer sequentially over a semiconductor substrate;

patterning the nitride layer, the first oxide layer and the substrate to form a trench serving as an isolation structure;

forming a second oxide layer over the trench by oxidation;

depositing a third oxide layer to the trench to fill the trench;

forming an N well and a P well between trenches;

removing the nitride layer and the first oxide layer;

forming a fourth oxide layer over the substrate;

forming a first P⁻ region over the N well;

forming a first N⁻ region over the P well;

forming a P⁺ region over the N well;

forming an N⁺ region over the P well;

etching on the fourth oxide layer, the P⁺ region and the first P⁻ region to form a first opening, which exposes the N well, and etching the fourth oxide layer, the N⁺ region and the first N⁻ region to form a second opening, which exposes the P well;

performing a P-channel metal oxide semiconductor (PMOS) punch implantation and a threshold voltage ($V_t$) implantation on the N well;

performing an N-channel metal oxide semiconductor (NMOS) punch implantation and a threshold voltage ($V_t$) implantation on the P well;

removing the fourth oxide layer;

forming a gate oxide layer over the substrate, forming a first conductive layer over the gate oxide layer at the bottom of the first opening in the N well, and a second conductive layer over the gate oxide layer at the bottom of the second opening in the P well;

lightly doping the N well with a P-type dopant to form a second $P^-$ region under the first opening on the N well; and lightly doping the P well with an N-type dopant to form a second $N^-$ region under the second opening on the P well.

3. The method of claim 1, wherein the step of depositing the third oxide layer comprises high-density-plasma chemical vapor deposition (HDPCVD).

4. The method of claim 1, wherein the step of forming the N well or the P well comprises doping with an N-type dopant or a P-type dopant, respectively, and a thermal process for driving in the dopants to form the N well and the P well.

5. The method of claim 1, wherein the step of forming the first $P^-$ region or the first $N^-$ region comprises a light doping with a P-type dopant or an N-type dopant, respectively.

6. The method of claim 1, wherein the step of forming the first $P^-$ region or the first $N^-$ region comprises a P-type dopant or an N-type dopant being lightly implanted on the N well and the P well, respectively, and a thermal process being performed to drive the dopants in to form the first $P^-$ region and the first $N^-$ region.

7. The method of claim 1, wherein the step of forming the first $P^+$ region or the first $N^+$ region comprises a heavy doping with a P-type dopant or an N-type dopant, respectively.

8. The method of claim 1, wherein the step of forming the first $P^+$ region or the first $N^+$ region comprises a P-type dopant or an N-type dopant being heavily implanted in the N well or the P well, respectively and a thermal process being performed to drive the dopants in to form the first $P^+$ region or the first $N^+$ region, respectively.

9. The method of claim 1, wherein the step of performing etching to form the first opening and the second opening comprises dry etching.

10. The method of claim 1, wherein the step of removing the fourth oxide layer and forming the fifth oxide layer is for the purpose of rounding a plurality of sharp corners on the substrate.

11. The method of claim 1, wherein the step of performing the PMOS punch implantation and the $V_t$ implantation comprises $P^{31}$ and $BF_2^+$, respectively.

12. The method of claim 1, wherein the step of performing the NMOS punch implantation and the $V_t$ implantation comprises $B^{11}$ and $BF_2^+$, respectively.

13. The method of claim 1, wherein the first conductive layer and the second conductive layer comprise doped polysilicon.

14. The method of claim 1, wherein the step of forming the first conductive layer and the second conductive layer further comprises forming a polysilicon layer over the gate oxide layer, doping the polysilicon, and patterning the doped polysilicon to form the first conductive layer within the first opening and the second conductive layer within the second opening.

15. The method of claim 1, wherein the first conductive layer and the second conductive layer cover a portion of the bottoms of the first opening and the second opening.

16. The method of claim 2, wherein the step of depositing the third oxide layer comprises high-density-plasma chemical vapor deposition (HDPCVD).

17. The method of claim 2, wherein the step of forming the N well or the P well comprises doping with an N-type dopant or a P-type dopant, respectively, and a thermal process for driving in the dopants to form the N well and the P well.

18. The method of claim 2, wherein the step of forming the first $P^-$ region or the first $N^-$ region comprises a light doping with a P-type dopant or an N-type dopant, respectively.

19. The method of claim 2, wherein the step of forming the first $P^-$ region or the first $N^-$ region comprises a P-type dopant or an N-type dopant being lightly implanted on the N well and the P well, respectively, and a thermal process being performed to drive the dopants in to form the first $P^-$ region and the first $N^-$ region.

20. The method of claim 2, wherein the step of forming the first $P^+$ region or the first $N^+$ region comprises a heavy doping with a P-type dopant or an N-type dopant, respectively.

21. The method of claim 2, wherein the step of forming the first $P^+$ region or the first $N^+$ region comprises a P-type dopant or an N-type dopant being heavily implanted in the N well or the P well, respectively, and a thermal process being performed to drive the dopants in to form the first $P^+$ region or the first $N^+$ region, respectively.

22. The method of claim 2, wherein the step of performing etching to form the first opening and the second opening comprises dry etching.

23. The method of claim 2, wherein the step of performing the PMOS punch implantation and the $V_t$ implantation comprises $P^{31}$ and $BF_2^+$, respectively.

24. The method of claim 2, wherein the step of performing the NMOS punch implantation and the $V_t$ implantation comprises $B^{11}$ and $BF_2^+$, respectively.

25. The method of claim 2, wherein the first conductive layer and the second conductive layer comprise doped polysilicon.

26. The method of claim 2, wherein the step of forming the first conductive layer and the second conductive layer further comprises forming a polysilicon layer over the gate oxide layer, doping the polysilicon, and patterning the doped polysilicon to form the first conductive layer within the first opening and the second conductive layer within the second opening.

27. The method of claim 2, wherein the first conductive layer and the second conductive layer cover a portion of the bottoms of the first opening and the second opening.

28. A method for fabricating a high bias metal oxide semiconductor device, the method comprising:

forming a first oxide layer and a nitride layer sequentially over a semiconductor substrate, patterning the nitride layer, the first oxide layer and the substrate to form trenches serving for isolation;

forming a second oxide layer over the trenches by oxidation;

depositing a third oxide layer in the trench to fill the trenches;

forming an N well between the trenches;

removing the nitride layer and the first oxide layer;

forming a fourth oxide layer over the substrate;

forming a first $P^-$ region over the N well;

forming a $P^-$ region over the N well;

performing etching on the fourth oxide layer, the $P^+$ region and the first $P^-$ region to form an opening, which exposes the N well;

performing a P-channel metal oxide semiconductor (PMOS) punch implantation and a threshold voltage ($V_t$) implantation on the N well;

removing the fourth oxide layer;

forming a gate oxide layer over the substrate;

forming a conductive layer over the gate oxide layer at the bottom of the opening on the N well; and lightly doping the N well with a P-type dopant to form a second P⁻ region under the opening in the N well.

29. The method of claim 28, wherein the step of depositing the third oxide layer comprises high-density-plasma chemical vapor deposition (HDPCVD).

30. The method of claim 28, wherein the step of forming the N well comprises doping with an N-type dopant, and a thermal process being performed for driving the dopant in to form the N well.

31. The method of claim 28, wherein the step of forming the first P⁻ region comprises the first P⁻ region being lightly doped with a P-type dopant.

32. The method of claim 28, wherein the step of forming the first P⁻ region comprises a P-type dopant being lightly implanted on the N well, and a thermal process being performed for driving the dopants in to form the first P⁻ region.

33. The method of claim 28, wherein in the step of forming the first P⁺ region, the first P⁺ region is heavily doped with a P-type dopant.

34. The method of claim 28, wherein the step of forming the first P⁺ region comprises a P-type dopant being heavily implanted in the N well, and a thermal process being performed to drive the dopants in to form the first P⁺ region.

35. The method of claim 28, wherein the step of performing etching to form the opening comprises dry etching.

36. The method of claim 28, wherein the step of performing the PMOS punch implantation and the $V_t$ implantation comprises $P^{31}$ and $BF_2^+$, respectively.

37. The method of claim 28, wherein the conductive layer comprises doped polysilicon.

38. The method of claim 28, wherein the step of forming the conductive layer further comprises forming a polysilicon layer over the gate oxide layer, doping the polysilicon, and patterning the doped polysilicon to form the conductive layer within the opening.

39. The method of claim 28, wherein the conductive layer covers a portion of the bottom of the opening.

40. A method for fabricating a high bias metal oxide semiconductor device, the method comprising:

forming a first oxide layer and a nitride layer sequentially over a semiconductor substrate;

patterning the nitride layer, the first oxide layer and the substrate to form trenches serving as an isolation structure;

forming a second oxide layer over the trenches by oxidation;

depositing a third oxide layer in the trench to fill the trenches;

forming a P well between the trenches;

removing the nitride layer and the first oxide layer;

forming a fourth oxide layer over the substrate;

forming a first N⁻ region over the P well;

forming an N⁺ region over the P well;

etching on the fourth oxide layer, the N⁺ region and the first N⁻ region to form an opening, which exposes the P well;

performing an N-channel metal oxide semiconductor (NMOS) punch implantation and a threshold voltage ($V_t$) implantation on the P well;

removing the fourth oxide layer;

forming a gate oxide layer over the substrate;

forming a conductive layer over the gate oxide layer at the bottom of the opening in the P well; and lightly doping the P well with an N-type dopant to form a second N⁻ region under the opening in the P well.

41. The method of claim 40, wherein the step of depositing the third oxide layer comprises high-density-plasma chemical vapor deposition (HDPCVD).

42. The method of claim 40, wherein the step of forming the P well comprises doping with a P-type dopant, and a thermal process being performed to drive the dopant in to form the P well.

43. The method of claim 40, wherein the step of forming the first N⁻ region comprises the first N⁻ region being lightly doped with an N-type dopant.

44. The method of claim 40, wherein the step of forming the first N⁻ region comprises an N-type dopant being lightly implanted on the P well, and a thermal process being performed to drive the dopants in to form the first P⁻ region.

45. The method of claim 40, wherein in the step of forming the first N⁺ region, the first N⁺ region is heavily doped with an N-type dopant.

46. The method of claim 40, wherein the step of forming the first N⁺ region comprises an N-type dopant being heavily implanted in the P well, and a thermal process being performed to drive the dopants in to form the first N⁺ region.

47. The method of claim 40, wherein the step of performing etching to form the opening comprises dry etching.

48. The method of claim 40, wherein the step of performing the NMOS punch implantation and the $V_t$ implantation comprises $B^{11}$ and $BF_2^+$, respectively.

49. The method of claim 40, wherein the conductive layer comprises doped polysilicon.

50. The method of claim 40, wherein the step of forming the conductive layer further comprises forming a polysilicon layer over the gate oxide layer, doping the polysilicon, and patterning the doped polysilicon to form the conductive layer within the opening.

51. The method of claim 40, wherein the conductive layer covers a portion of the bottom of the opening.

* * * * *